United States Patent [19]

Söelkner

[11] Patent Number: 4,857,836

[45] Date of Patent: Aug. 15, 1989

[54] MECHANICAL PROBE FOR OPTICAL MEASUREMENT OF ELECTRICAL SIGNALS

[75] Inventor: Gerald Söelkner, Linz, Fed. Rep. of Germany

[73] Assignee: Siemens Aktiengesellschaft, Berlin and Munich, Fed. Rep. of Germany

[21] Appl. No.: 187,336

[22] Filed: Apr. 28, 1988

[30] Foreign Application Priority Data

Jun. 19, 1987 [DE] Fed. Rep. of Germany ....... 3719203

[51] Int. Cl.⁴ .................... G01R 31/00; G01R 31/02
[52] U.S. Cl. ................... 324/96; 324/158 P; 324/72.5; 324/158 D; 324/95
[58] Field of Search ............. 324/158 R, 96, 158 D, 324/95, 77 K, 158 P; 356/364, 368; 350/394, 395, 392, 393; 333/248

[56] References Cited

U.S. PATENT DOCUMENTS

| | | | |
|---|---|---|---|
| 3,938,039 | 2/1976 | Hermstein et al. | 324/96 X |
| 4,070,621 | 1/1978 | Bassen et al. | 324/96 X |
| 4,269,483 | 5/1981 | Feldtkeller | 324/96 X |
| 4,329,580 | 5/1982 | Riley et al. | 324/95 X |
| 4,563,093 | 1/1986 | Tada et al. | 356/368 X |
| 4,603,293 | 7/1986 | Mourou et al. | 324/96 X |
| 4,629,323 | 12/1986 | Matsumoto | 356/368 X |

OTHER PUBLICATIONS

Valdmanis et al., "Subpicosecond Electrical Sampling and Applications"; *Picosecond Optoelectric Devices,* Academic Press, Inc., 1984; pp. 249–269.
"NonContact Electro Optic Sampling with GaAs in Laser"; *Electronics Letters;* 14th Aug. 1986; vol. 22, No. 17; p. 918.

*Primary Examiner*—Reinhard J. Eisenzopf
*Assistant Examiner*—Vinh P. Nguyen
*Attorney, Agent, or Firm*—Hill, Van Santen, Steadman & Simpson

[57] ABSTRACT

A mechanical probe for optical measurement of electrical signals. The probe for optical measurement of electrical signals with high chronological resolution is composed of a cuboid electro-optical crystal, of a co-planar waveguide structure located on a lateral face of the crystal and of a metallic tip applied to the end face of the crystal adjacent a measuring location. The signal at the measuring location, for example at an interconnect of an integrated circuit is taken with the metallic tip and is fed into the co-planar waveguide structure composed of two strip-shaped metallizations. Probe holders or electrostrictive manipulators known in the art of electrical metrology (probe measuring location) can be used for exact positioning of the probe onto the measuring location.

12 Claims, 1 Drawing Sheet

MECHANICAL PROBE FOR OPTICAL MEASUREMENT OF ELECTRICAL SIGNALS

BACKGROUND OF THE INVENTION

The present invention is directed to a mechanical probe for optical measurement of electrical signals.

A probe composed of an electro-optical crystal is disclosed in a publication by J. A. Valdmanis, "Subpicosecond Electrical Sampling and Applications", that appeared in Picosecond Optoelectronic Devices, Academic Press, Inc., 1984, pages 249-270, particularly pages 257-258 including FIG. 7. However, only measurements on specific structures can be carried out with this probe.

A probe used for electro-optical sampling methods is disclosed in Electronics Letters, 14 August, 1986, Vol. 22, No. 17, pages 918-919.

SUMMARY OF THE INVENTION

It is an object of the present invention to provide a mechanical probe of the species intially cited with which electrical signals at arbitrary points on an electronic circuit, particularly of a micro-electronic circuit, can be optically measured with high chronological resolution.

The mechanical probe has an electro-optical crystal which receives electro-magnetic radiation. The probe also has a measuring tip connected to a waveguide structure located on the crystal. The advantage obtainable with the present invention is that signals in integrated circuits can be optically measured with high chronological resolution.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1A:
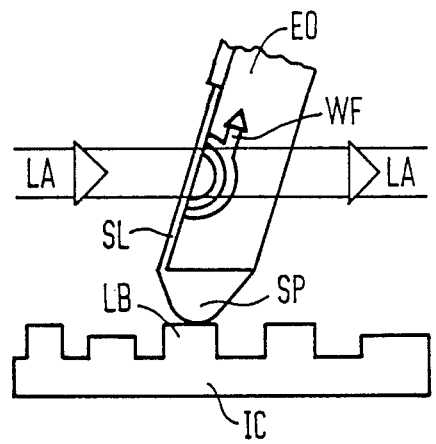
FIG. 1a is a cross-sectional diagram depicting the mechanical probe of the present invention.
Figure 1B:
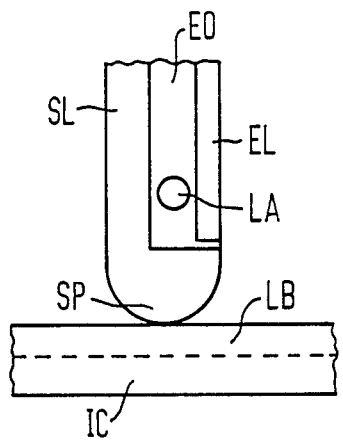
FIG. 1b, is a side view of the FIG. 1a mechanical probe.

The mechanical probe-schematically shown in FIGS. 1a and 1b is composed of a cubic, electro-optical crystal EO (Pockels Crystal), composed of for example lithium tantalate $LiTaO_3$, zinc selenite ZnSe or gallium arsenide GaAs; of a co-planar waveguide structure SL, EL arranged on one lateral surface of the crystal EO; and of a metallic tip SP applied to an end face of the crystal at the test subject side. The signal at a measuring location, for example at an interconnect LB of an integrated circuit IC, is taken with the metallic tip SP and is fed into the co-planar waveguide structure composed of two strip-shaped metallizations SL, EL. The time-dependency of the signal traveling in the waveguide structure with the speed $v_s < c$ (c = speed of light) can be measured in a known way (see, for example, the publications initially cited) upon utilization of the linear electro-optical effect (Pockels Effect). The speed $V_s$ is measured with the use of a polarized laser beam LA that detects the electrical traveling-wave WF in the crystal EO. A sampling method is typically used wherein the laser beam LA generated in a scanning laser microscope and proceeding parallel to the component surface is synchronized with the signal from the interconnect LB. The phase relation of the laser pules relative to the signal is continuously modified, for example by lengthening or shortening the beam path between laser sources and crystal EO. In order to minimize the dispersion, the laser beam LA should penetrate the electro-optical crystal EO in the immediate proximity of the metallic tip between the strip-shaped metallizations SL and EL of the waveguide structure that act as a signal line or grounded line (see FIG. 1b). Conventional probe holders known in the art of electrical metrology (probe measuring location) can be used for positioning the roughly 0.5 through 1 mm long electro-optical crystal EO onto the interconnect LB. These probe holders are attached with magnetic or vacuum adapters to a stage or platform that is precisely, linearly height-adjustable with four synchronously running guide spindles. Such a probe holder is usually composed of a holder for the acceptance of the probe, of a probe arm and of a precise mechanism that allows a linear displacement of the probe in three directions that are orthogonal to one another. Instead of this probe holder, electrostrictive manipulators having a positioning precision of about 0.1 $\mu$ which is adequate for modern LSI circuits can also be used.

For matching the propagation speed C of the laser beam LA in the electro-optical crystal EO to the propagation speed $v_s < c$ of the electrical traveling-wave WF to be sampled with the laser probe LA, the longitudinal axis of the mechanical probe must form an angle alpha with the propagation direction of the laser beam LA which is different from 90°. For $LiTaO_3$, this angle alpha, dependent of the electro-optical material used, is approximately 72°.

Figure 2:
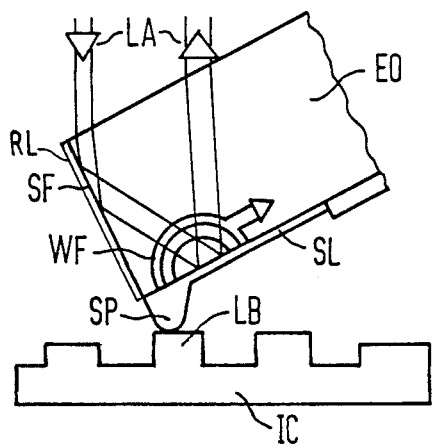
FIG. 2 is a cross-sectional diagram depicting an alternative embodiment of the present invention.

The mechanical probe schematically illustrated in FIG. 2 allows the use of a laser beam LA, incident perpendicularly relative to the component surface to be used for sampling the electrical traveling-wave WF which is generated in the cuboid electro-optical EO. In this exemplary embodiment, the signal at the interconnect LB is fed into the waveguide structure located at the underside of the crystal via a metallic tip SP. The waveguide structure also serves as a mirror for the laser beam LA which is totally reflected at the end face SF of the crystal EO. The angle of total reflection can thereby be set with the manipulators or, probe holders such that the component of the propagation speed of the laser beam measured in the direction of the longitudinal axis of the probe nearly coincides with the propagation speed $v_s$ of the electrical traveling-wave WF (for $LiTaO_3$, the angle of the total reflection amounts to about 90−72 =18°). In comparison to the mechanical probe of FIG. 1a, the exemplary embodiment shown in FIG. 2 has the advantage that the optical system (scanning laser microscope) used for imaging the subject surface or for positioning the probe onto the measuring location is identical with the measuring means for recording the signal.

The invention is not limited to the exemplary embodiments that have been set forth. Thus, the surface of the electro-optical crystal at the subject side shown in FIG.

2 can also be provided with a reflective layer RL. Different waveguide arrangements can also be used instead of the waveguide structure composed of two strip-shaped metallizations SL, EL. The metallic tip SP for contacting the measuring location LB can, for example, be produced by vapor-deposition on the end face of the electro-optical crystal EO at the subject side.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A mechanical probe for optical measurement of electrical signals and having an electro-optical crystal penetrated by electro-magnetic radiation, comprising a measuring tip and a waveguide structure that is conductively connected to the measuring tip, the waveguide structure and the measuring tip each located on a face of the electro-optical crystal.

2. The mechanical probe according to claim 1, wherein the waveguide structure is located on a face of the electro-optical crystal that faces toward a radiation source.

3. The mechanical probe according to claim 1, wherein the waveguide structure is located on a face of the electro-optical crystal lying opposite a radiation source.

4. The mechanical probe according to claim 1, wherein a face of the electrical-optical crystal carrying the waveguide structure is aligned relative to the electro-magnetic radiation such that a component of the speed of light of the electro-magnetic radiation in the electro-optical crystal is approximately identical to the speed of a signal, $V_s$, in the waveguide structure.

5. The mechanical probe according to claim 3, wherein the face of the electro-optical crystal carrying the waveguide structure is provided with a reflective layer.

6. The mechanical probe according to claim 1, wherein the waveguide structure is co-planar and is composed of two strip-shaped metallizations.

7. A mechanical probe for optical measurement of electrical signals having an electro-optical crystal penetrated by electro-magnetic radiation, comprising:
    a measuring tip located on an end of the crystal; and
    a waveguide structure conductively connected to the measuring tip and located on a face of the crystal which is aligned relative to the radiation such that a component of the speed of light of the electro-magnetic radiation in the electro-optical crystal is approximately identical to the speed of an electrical traveling wave signal in the waveguide structure.

8. The mechanical probe according to claim 7, wherein the waveguide structure is located on a face of the electro-optical crystal that faces toward a source of the radiation.

9. The mechanical probe according to claim 7, wherein the waveguide structure is located on a face of the electro-optical crystal lying opposite a source of the radiation.

10. The mechanical probe according to claim 9, wherein the face of the electro-optical crystal carrying the waveguide structure is provided with a reflective layer.

11. The mechanical probe according to claim 7, wherein the waveguide structure is co-planar and is composed to two strip-shaped metallizations.

12. A mechanical probe for optical measurement of electrical signals and having an electro-optical crystal penetrated by electro-magnetic radiation, comprising a measuring tip and a waveguide structure that is conductively connected to the measuring tip, the waveguide structure and the measuring tip each located on a face of the electro-optical crystal, the face of the electrical-optical crystal carrying the waveguide structure being aligned relative to the electro-magnetic radiation such that a component of the speed of light of the electro-magnetic radiation in the electro-optical crystal is approximately identical to the speed of a signal, $V_s$, in the waveguide structure.

* * * * *